United States Patent [19]

O'Neill

[11] 4,144,525
[45] Mar. 13, 1979

[54] CASCADABLE ANALOG TO DIGITAL CONVERTER

[75] Inventor: John F. O'Neill, Boulder, Colo.

[73] Assignee: Bell Telephone Laboratories, Incorporated, Murray Hill, N.J.

[21] Appl. No.: 844,229

[22] Filed: Oct. 21, 1977

[51] Int. Cl.² .......................................... H03K 13/20
[52] U.S. Cl. ............................................ 340/347 AD
[58] Field of Search .................. 340/347 M, 347 AD; 324/99 D

[56] References Cited

U.S. PATENT DOCUMENTS 3,148,366 9/1964 Schulz .......................... 340/347 AD Primary Examiner—Charles D. Miller
Attorney, Agent, or Firm—Roy C. Lipton

[57] ABSTRACT

A circuit for converting an input analog signal into a digital representation and a remainder signal is disclosed. The digital representation is generated by a coder that counts an integral number of clock cycles during an interval in which the magnitude of the input analog signal is compared with the magnitude of a ramp signal. The remainder signal is generated by duration-to-amplitude conversion of a pulse whose duration is the fractional remainder of the final uncounted clock cycle.

9 Claims, 4 Drawing Figures (PRIOR ART)

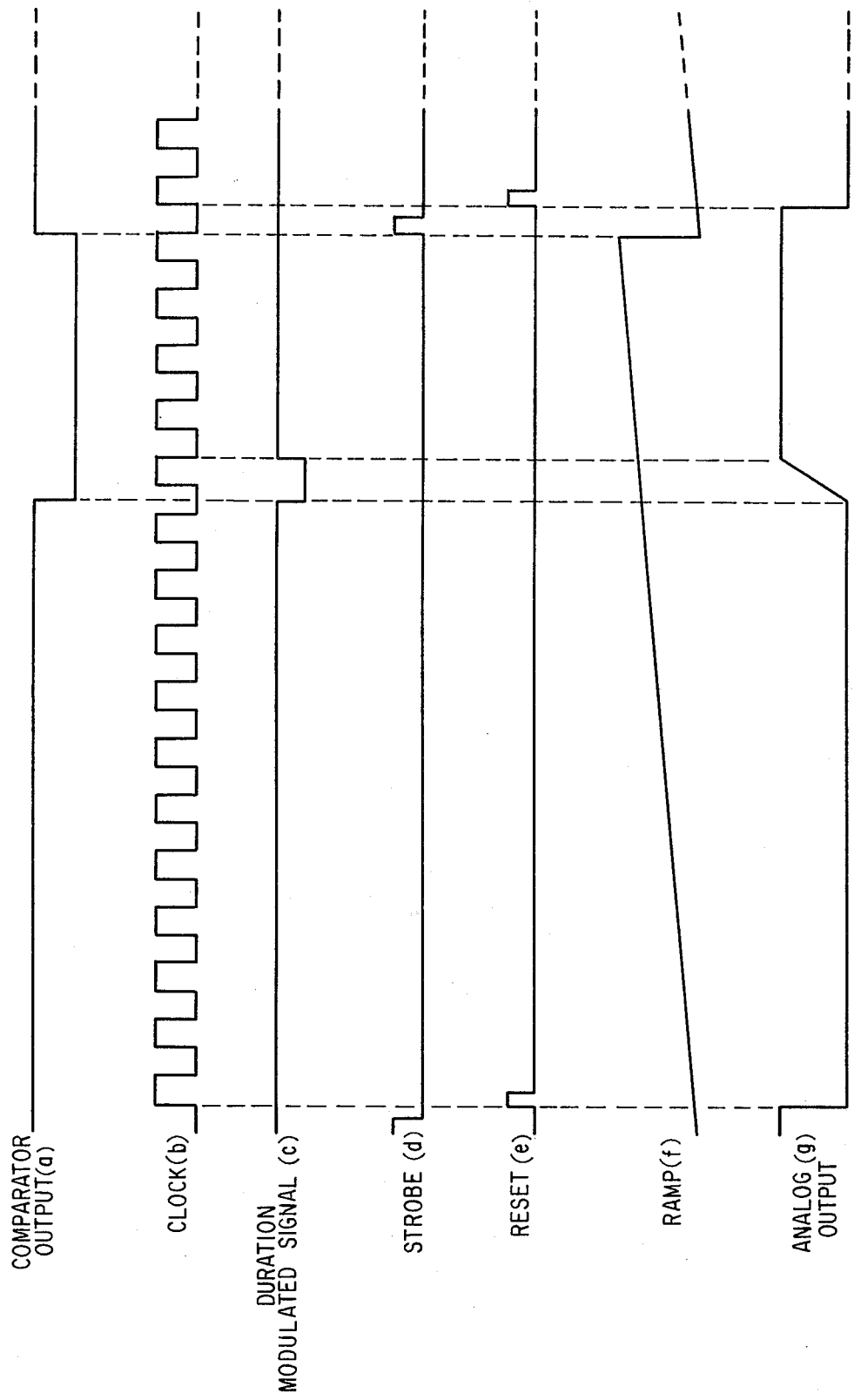

CASCADABLE ANALOG TO DIGITAL CONVERTER

FIELD OF THE INVENTION

This invention relates to high speed analog-to-digital converters and more specifically to partially-cascaded arrangements.

DESCRIPTION OF THE PRIOR ART

High speed analog-to-digital (A/D) conversion is often achieved through the expedient of parallel operation wherein a plurality of A/D converter stages provide a sequential process on an input analog signal. Each stage generates a digital approximation (comprising the most significant bits (MSR) of information) of the analog signal applied thereto and passes on to the next stage a remainder signal corresponding to the least significant bits (LSB) of information. Formation of the remainder signal is achieved by a intricate process that requires precise digital-to-analog (D/A) conversion of the newly formed digital approximation to yield an analog approximation. The analog approximation is then subtracted from the analog signal applied to the stage input to form the remainder signal. The range of possible remainder signals is scaled by amplification to correspond to the range of possible stage input signals so that identical stages may be cascaded. Each stage (except the last) generates a remainder signal that includes a certain amount of error due to the intricate process itself. The error is multiplied by each succeeding stage thereby degrading the overall conversion accuracy.

High precision D/A converters are used in forming the remainder signal but are complex and often require costly component selection or adjustment on a circuit by circuit basis.

It is therefore an object of this invention to provide highspeed A/D conversion with improved accuracy.

It is another object of this invention to reduce complexity and cost in multistage A/D converters.

SUMMARY OF THE INVENTION

The present invention is characterized by an arrangement for converting the amplitude of an input analog signal into a first duration modulated signal by: counting discrete events of a timing signal that occur during an interval of said duration modulated signal, forming a second duration modulated signal containing remainder information and converting the second duration modulated signal into an amplitude level. A remainder signal is thereby accurately formed without the need for precision D/A conversion, subtraction circuitry or a separate amplifier.

It is a feature of this invention that the remainder information is embodied in a duration modulated signal.

It is another feature of this invention that amplification is included in the duration-to-amplitude conversion process.

It is yet another feature of this invention that the second duration modulated signal is a complementary remainder signal advantageously defined by the interval extending from the termination of the first duration modulated signal to the next discrete event of the timing signal.

The foregoing and other objects and features of this invention will be fully understood from the following description of an illustrative embodiment taken in conjunction with the accompanying drawings.

BRIEF DESCRIPTION OF THE DRAWINGS

In the drawings:

FIG. 3 illustrates waveforms associated with the embodiment of FIG. 2 that assist in understanding this invention.

DETAILED DESCRIPTION

Figure 1:
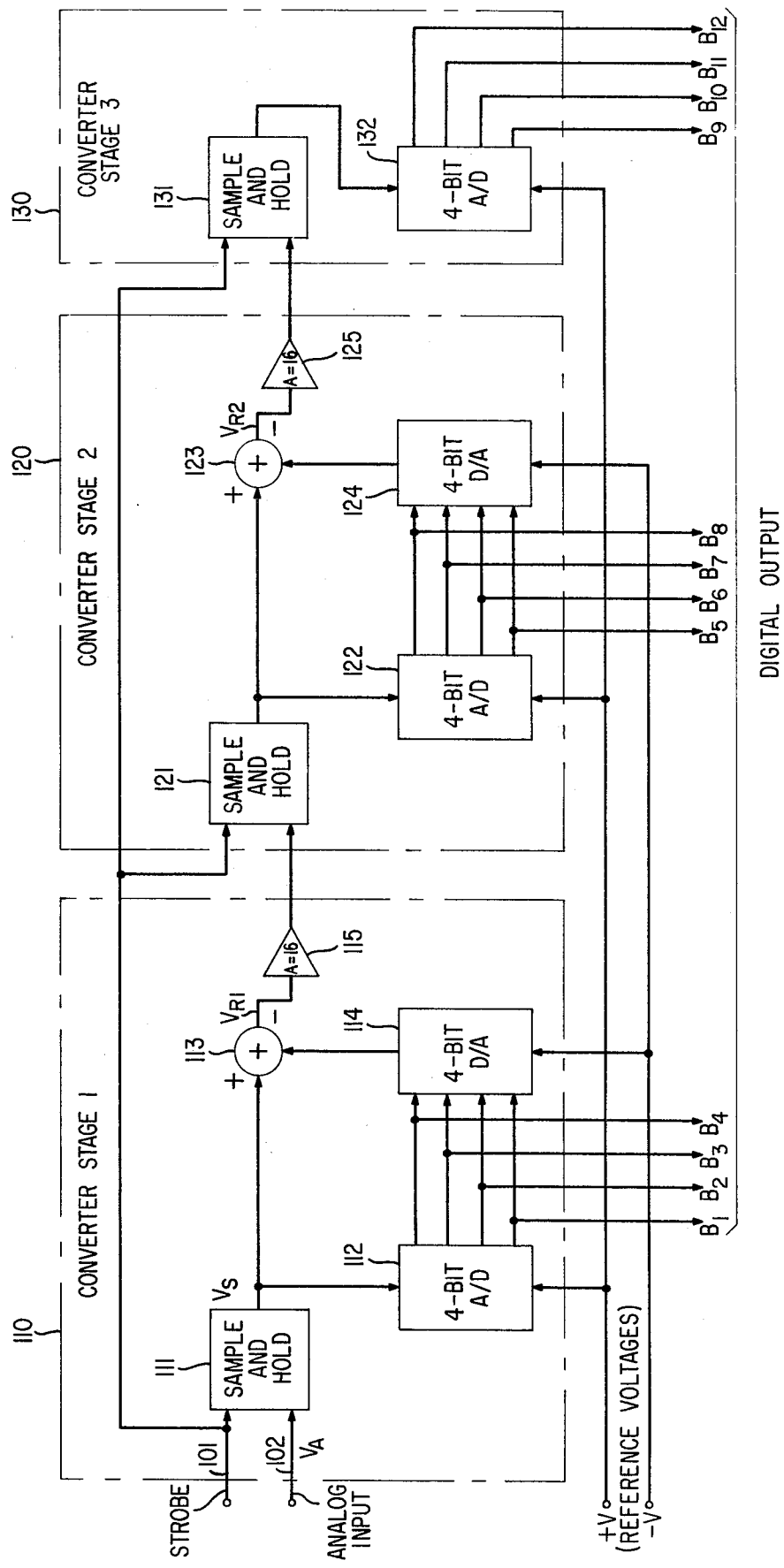
FIG. 1 discloses, in block form, a prior art three-stage partially-cascaded analog-to-digital converter.

The prior art disclosed in FIG. 1 illustrates a partially-cascaded technique, useful in performing high speed A/D conversion, which includes substantially identical first and second converter stages 110 and 120 and final stage 130. In the FIG. 1 embodiment input signal $V_A$ on input lead 102 of sample and hold circuit 111 in converter stage 110 is sampled by a strobe signal on input lead 101. Output sample voltage $V_S$ of sample and hold circuit 111 is a voltage level that remains constant between strobe pulses and changes in accordance with the analog input signal level at the instant of strobing. A/D converter 112 digitally approximates sample voltage $V_S$ with the binary digits $B_1$, $B_2$, $B_3$ and $B_4$. These digits represent the four most significant bits of the digital output signal. D/A converter 114 reconverts the binary digits into an analog voltage which is thereafter subtracted from sample voltage $V_s$ by subtraction circuit 113 to form a first remainder voltage $V_{R1}$. The remainder voltage is scaled by amplifier 115 and presented to the next stage which repeats the process to produce the next successive four bits of the digital signal.

If the same A/D and D/A converters are to be used throughout, the amplification factor becomes a function of the resolution of each stage. Here a resolution of one part in 16 leads to a required amplification factor of 16. Each converter stage therefore processes signals having the same dynamic range.

Three stages of processing are illustrated in FIG. 1 which results in a threefold speed increase for A/D conversion. Alternatively, a fourfold speed increase can be achieved by a four stage arrangement; each stage performing only a 3-bit A/D conversion to once again provide 12-bit overall resolution. It is noted that the final converter stage (converter stage 3 of FIG. 1) is simpler than the preceding ones because the structure needed to form a remainder signal is no longer required.

It is at this point that the principal advantage of the instant invention can be appreciated since it teaches a simpler and more accurate method for generating a remainder signal. The prior art of FIG. 1 requires a precision D/A converter in generating the remainder signal; inaccuracies in decoding are amplified by succeeding stages. In FIG. 1, for example, the second and third stages can have errors that are 16 and 256 times as large as the allowable error for the first stage. The improvement offered by the instant invention results from replacing the D/A converter, the subtraction circuit and the amplifier of the prior art circuit with a pulse-duration to pulse-amplitude converter. In many situations the range of the duration modulated pulse can be several microseconds; modern logic can provide for accuracy of a few nanoseconds in the pulse width with no adjustments required.

Figure 2:
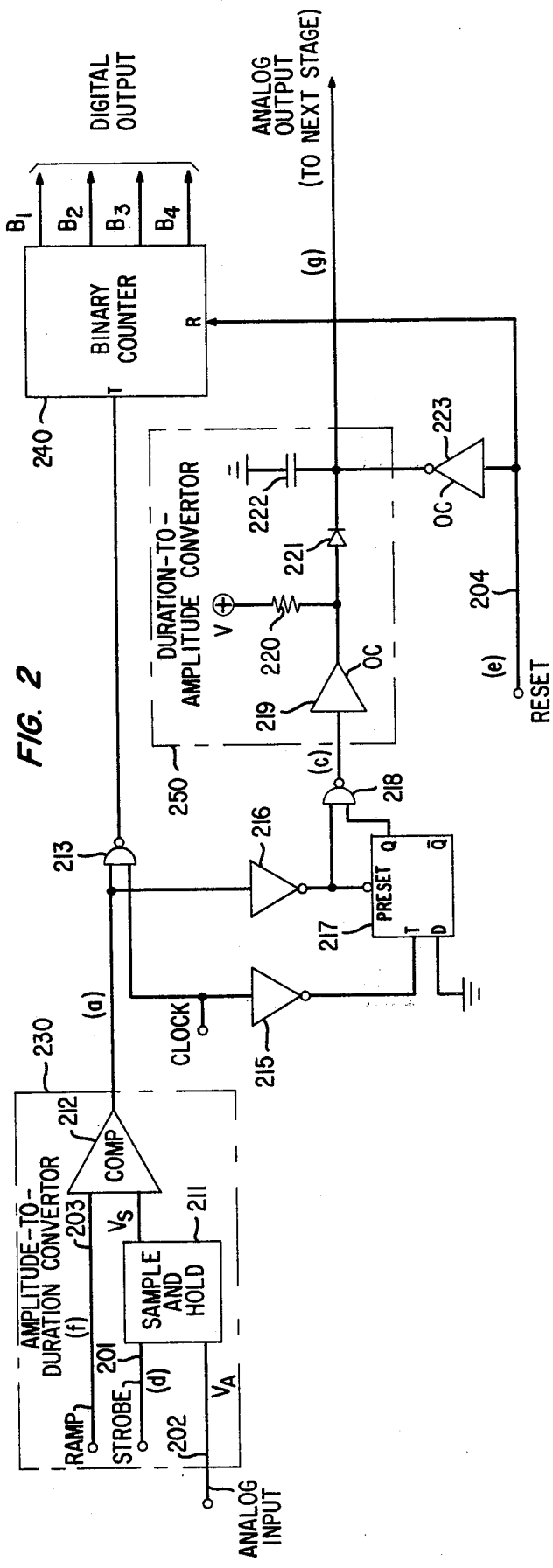
FIG. 2 shows, in schematic form, one stage of a partially-cascaded converter in accordance with this invention.

FIG. 2 is an illustrative embodiment of one stage of a partially-cascaded converter in accordance with the invention utilizing a simple counting coder to generate a digital output and a duration modulated pulse which is thereafter converted into a remainder voltage. Amplitude-to-duration converter 230 operates to generate a pulse whose duration is measured by binary counter 240 which is advanced by clock pulses during the aforementioned duration. A remainder duration is formed which is thereafter converted into a voltage amplitude by duration-to-amplitude converter 250 to form the remainder signal which is then passed on to the next stage. The instant invention therefore makes advantageous use of the inherent accuracy of operating in the time domain rather than the voltage domain to generate the remainder signal.

Amplitude-to-duration converter 230 includes sample and hold circuit 211 and comparator 212. Sample and hold circuit 211 operates in a manner similar to its FIG. 1 counterpart. A strobe signal on input lead 201 controls the time when analog input signal $V_A$ on input lead 202 is sampled. The output sample voltage $V_S$ of sample and hold circuit 211 is fed into comparator 212 for comparison with a ramp signal on input lead 203. The strobe signal is used to fix the time at which the ramp signal commences at one voltage level thereafter proceeding to another voltage level in a predetermined manner. Waveforms at certain identified locations of FIG. 2, such as waveform (f) on input lead 203, are shown in FIG. 3.

FIG. 3(f) illustrates a ramp signal having a constant slope; nonlinear coding (companding) is also possible and involves no more than reshaping the ramp signal or modulating the period of a clock signal. The same ramp signal serves all stages of a cascaded arrangement and can be centralized and shared among a bank of coders.

The output of comparator 212 is a logic 0 when the magnitude of the ramp voltage exceeds the magnitude of sample voltage $V_S$ and a logic 1 otherwise. A binary digital output signal is generated by binary counter 214 which is arranged to count pulses of a periodic clock signal during the interval that the magnitude of sample voltage $V_S$ exceeds the magnitude of the ramp signal; NAND gate 213 gates clock pulses to binary counter 240 during this interval in accordance with techniques used by conventional counting coders. A reset signal on input lead 204 clears the binary counter every 16 clock pulses. The binary counter advances on positive going transitions of a binary signal at its toggle (T) input. The output of binary counter 240 contains the MSB information as a binary digital signal. It should be noted that the LSB information is related to the duration between the last clock pulse toggling flip-flop 240 and the event that the ramp signal exceeds the analog sample voltage. Since the last clock pulse before the aforementioned event is not known beforehand, it is convenient to measure the complementary duration residing between the event that the ramp signal exceeds the analog sample voltage and the next clock pulse. This complementary pulse is easily accommodated by inverting the binary counter outputs of even numbered stages; this in effect reverses the counting direction (i.e., changes an up counter into a down counter). Although constant reference is made to the remainder signal it will be understood that the illustrative embodiment of FIG. 2 generates a complementary remainder signal.

A time interval containing the LSB information is generated by circuits 215-218 of FIG. 2. Inverters 215 and 216 merely invert the phase of their input signals to adapt the phase of the clock signal and the comparator output signal to the operating characteristics of flip-flop 217 shown below:

TABLE I

| Asynchronous Operation | | | Clocked Operation (positive-edge toggling) | | |
|---|---|---|---|---|---|
| | | | $t_n$ | $t_n + 1$ | |
| Preset | Q | $\overline{Q}$ | D | Q | $\overline{Q}$ |
| 0 | 1 | 0 | 0 | 0 | 1 |
| 1 | Q | $\overline{Q}$ | 1 | 1 | 0 |

When the magnitude of the ramp signal exceeds the magnitude of sample voltage $V_S$ the output of comparator 212 becomes a logic 0 which precludes clock pulses (via NAND gate 213) from further advancing binary counter 240 and removes the forcing condition from the preset lead of flip-flop 217. Accordingly, the output of NAND gate 218 becomes a logic 0 and remains there for the remainder of the present clock cycle as a measure of the complementary LSB information (i.e., it contains a fractional portion of a clock cycle whereas binary counter 240 contains an integral number of clock cycles).

A negative transition of the clock pulse, inverted by inverter 215, ends the clock cycle and causes the Q lead of flip-flop 217 to become a logic 0. Accordingly, the output of NAND gate 218 becomes a logic 1. The negative pulse out of gate 218 is ready to be amplitude modulated by duration-to-amplitude converter 250. The output component of inverter 219 is an open collector transistor which is in the off state during the aforementioned negative pulse. At this time capacitor 223 charges toward voltage V through resistor 220 and diode 221. At the end of said negative pulse the output transistor of inverter 219 turns on (i.e. saturates), but diode 221 precludes this disturbance from affecting the voltage built up on capacitor 222. The voltage on capacitor 222 is the amplified remainder voltage where the desired amplification factor (16 in this example) is substantially controlled by the magnitudes of resistor 220, capacitor 222 and voltage V.

During strobe pulses the analog and digital output signals are suitable for readout purposes. Shortly after each strobe pulse a reset pulse clears the binary counter and causes the voltage built up on capacitor 222 to discharge through the output transistor of inverter 223.

Figure 4:
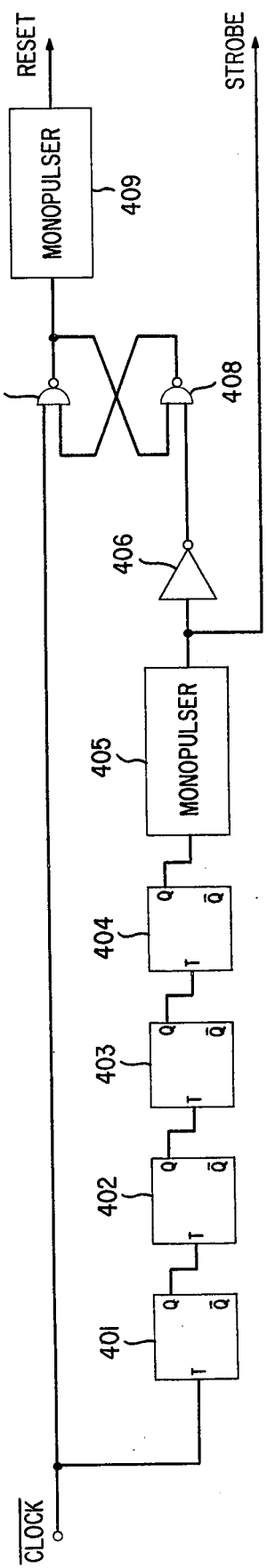
FIG. 4 shows, in schematic form, the circuitry required to generate "strobe" and "reset" signals utilized in the invention.

FIG. 4 shows the circuitry required to generate the strobe and the reset signals illustrated in FIG. 3 and used in FIG. 2. The clock signal of FIG. 3(b) is inverted and used to drive positive-edge toggled flip-flop 401 which is the first stage of a 4-stage binary divider comprising flip-flops 401–404. Monopulser 405 delivers a short positive pulse (see FIG. 3(d)) on every positive-going transition at its input to thereby generate the strobe signal. Inverter 406 inverts the strobe signal and drives one side of an R-S flip-flop comprising NAND gates 407 and 408. Monopulser 409, having the same operating characteristic as monopulser 405, delivers a short positive pulse (see FIG. 3(e)) on every positive-going transition at its input to thereby generate the reset signal. Gates 406–408 are arranged to deliver a positive-going transition to monopulser 409 one-half cycle (of the clock signal) after the strobe signal.

The ramp signal is generated by circuitry well known in the prior art. One such generator is disclosed in U.S. Pat. No. 3,990,073, issued to D. L. Duttweiler on Nov. 2, 1976.

Although a specific embodiment of this invention has been shown and described, it will be understood that various modifications may be made without departing from the spirit of this invention.

What is claimed is:

1. A circuit for converting an analog signal level into a digital approximation and a remainder signal, said remainder signal being a measure of the error between the analog signal level and the digital approximation, including means for converting the analog signal level into a duration modulated signal and means for counting discrete events of a timing signal during the duration of said duration modulated signal, characterized by:

means responsive to an interval between the termination of the duration modulated signal and a timing signal discrete event which is adjacent in time to said termination, for generating the remainder signal.

2. A ciruit according to claim 1 wherein the converting means includes means for comparing the magnitude of the analog signal level with the magnitude of a time varying signal.

3. A circuit according to claim 1 wherein the generating means includes duration-to-amplitude conversion.

4. A circuit according to claim 3 wherein amplification is controllably provided in the duration-to-amplitude conversion process.

5. A circuit according to claim 1 wherein the generating means is responsive to the interval extending between the termination of the duration modulated signal and the next discrete event of the timing signal for generating a complementary remainder signal.

6. In a multistage analog to digital converter wherein each stage generates a portion of a digital representation of an analog signal level, the portion being formed by means for counting discrete events of a timing signal occurring during a first time interval representing the analog signal level, characterized by:

means responsive to the termination of the first time interval and a time adjacent discrete event of the timing signal for generating a second time interval, said second time interval being a measure of the error between the analog signal level and the digital representation of the analog signal level; and means for effectively amplifying said second time interval by a predetermined factor.

7. In a converter according to claim 6 wherein the predetermined factor is proportional to the highest possible number count of said one portion; whereby the amplification is inversely proportional to the resolution.

8. In a converter according to claim 6 wherein the amplifying means includes means for performing duration-to-amplitude conversion and amplitude-to-duration conversion.

9. In a converter according to claim 6 wherein the second time interval extends between the termination of the first time interval and the next discrete event of the timing signal to thereby form a complementary remainder signal.

* * * * *